United States Patent
Nordin et al.

(10) Patent No.: US 9,049,803 B2
(45) Date of Patent: Jun. 2, 2015

(54) THERMAL MANAGEMENT INFRASTRUCTURE FOR IT EQUIPMENT IN A CABINET

(71) Applicants: Ronald A. Nordin, Naperville, IL (US); Surendra Chitti Babu, New Lenox, IL (US); Masud Bolouri-Saransar, Orland Park, IL (US)

(72) Inventors: Ronald A. Nordin, Naperville, IL (US); Surendra Chitti Babu, New Lenox, IL (US); Masud Bolouri-Saransar, Orland Park, IL (US)

(73) Assignee: Panduit Corp., Tinley Park, IL (US)

( * ) Notice: Subject to any disclaimer, the term of this patent is extended or adjusted under 35 U.S.C. 154(b) by 429 days.

(21) Appl. No.: 13/623,644

(22) Filed: Sep. 20, 2012

(65) Prior Publication Data
US 2013/0077232 A1  Mar. 28, 2013

Related U.S. Application Data

(60) Provisional application No. 61/537,657, filed on Sep. 22, 2011.

(51) Int. Cl.
*H05K 7/20* (2006.01)
*G06F 1/20* (2006.01)

(52) U.S. Cl.
CPC ........ *H05K 7/20809* (2013.01); *H05K 7/20818* (2013.01)

(58) Field of Classification Search
CPC .......... H05K 7/20636; H05K 7/20645; H05K 7/20672; H05K 7/20681; H05K 7/20772; H05K 7/20781; H05K 7/20809; H05K 7/20818
See application file for complete search history.

(56) References Cited

U.S. PATENT DOCUMENTS

| | | | | |
|---|---|---|---|---|
| 6,643,132 B2 * | 11/2003 | Faneuf et al. | | 361/700 |
| 6,657,121 B2 * | 12/2003 | Garner | | 174/16.3 |
| 6,693,797 B2 * | 2/2004 | Faneuf et al. | | 361/689 |
| 6,700,785 B2 * | 3/2004 | Berry et al. | | 361/726 |
| 6,776,221 B2 * | 8/2004 | Montgomery et al. | | 165/46 |
| 6,796,372 B2 * | 9/2004 | Bear | | 165/104.21 |
| 6,836,407 B2 * | 12/2004 | Faneuf et al. | | 361/679.49 |
| 6,972,365 B2 * | 12/2005 | Garner | | 174/16.3 |
| 7,012,807 B2 * | 3/2006 | Chu et al. | | 361/699 |
| 7,071,408 B2 * | 7/2006 | Garner | | 174/16.3 |
| 7,133,283 B2 * | 11/2006 | Faneuf et al. | | 361/689 |
| 7,233,491 B2 * | 6/2007 | Faneuf et al. | | 361/689 |
| 7,403,384 B2 * | 7/2008 | Pflueger | | 361/688 |
| 7,539,020 B2 * | 5/2009 | Chow et al. | | 361/726 |
| 7,599,184 B2 * | 10/2009 | Upadhya et al. | | 361/699 |
| 7,952,873 B2 * | 5/2011 | Glahn et al. | | 361/699 |
| 8,164,901 B2 | 4/2012 | Neudorfer | | |
| 8,289,710 B2 * | 10/2012 | Spearing et al. | | 361/701 |
| 2003/0128515 A1 | 7/2003 | Fancuf et al. | | |
| 2010/0319883 A1 | 12/2010 | Facusse | | |

FOREIGN PATENT DOCUMENTS

EP   0580412 A1 *  1/1994  ............. H05K 7/20

* cited by examiner

*Primary Examiner* — Robert J Hoffberg
(74) *Attorney, Agent, or Firm* — Christopher S. Clancy; Yuri Astvatsaturov

(57) ABSTRACT

The present invention attempts to reduce the thermal resistance with the use of heat-transfer devices (e.g., vapor chambers) placed directly on the heat-generating components in IT equipment and the integration of a cold plate within the cabinet. In some embodiments, the present invention is a thermal management system comprising a cabinet-side thermal management system and a server-side thermal management system using moveable thermal components.

19 Claims, 20 Drawing Sheets

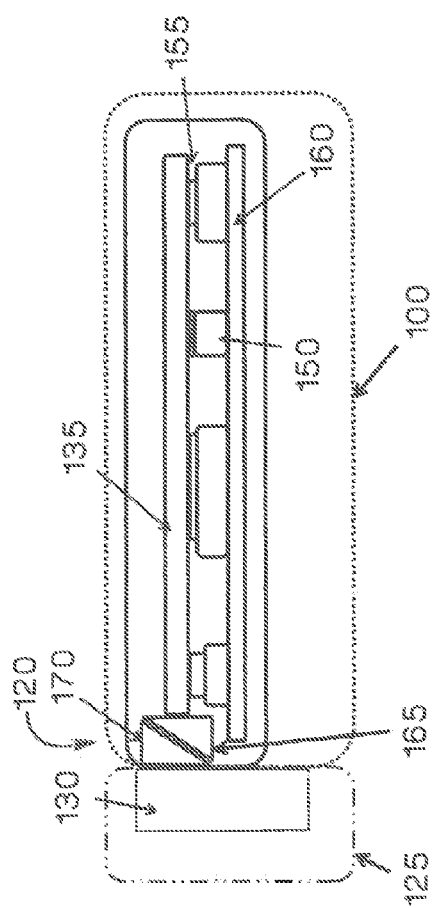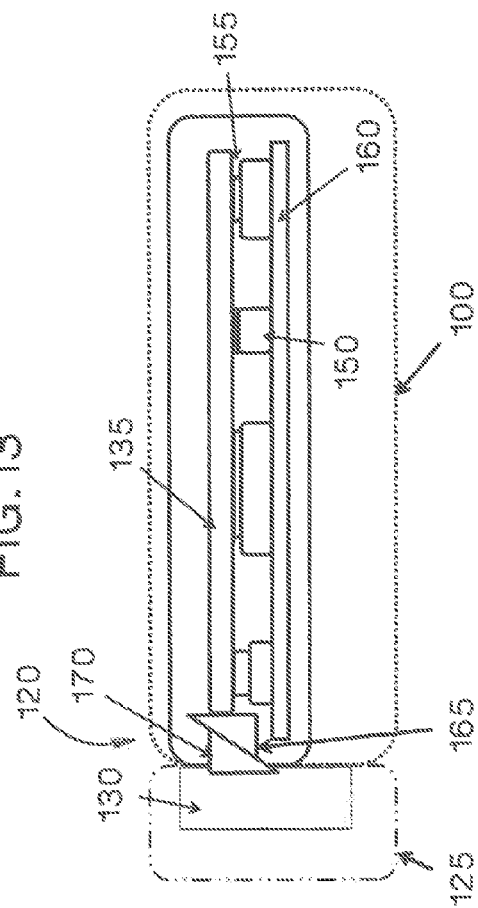

THERMAL MANAGEMENT INFRASTRUCTURE FOR IT EQUIPMENT IN A CABINET

CROSS-REFERENCE TO RELATED APPLICATIONS

This application claims the benefit of U.S. Provisional Patent Application No. 61/537,657 filed on Sep. 22, 2011.

BACKGROUND

Cooling of datacenters has become a serious challenge due to the increase in equipment density, processing power, and energy consumption. Server manufacturers constantly integrate new technologies into their products to offer advanced features and functionality to their customers. This results in higher computing power servers leading to high power dissipation. If this heat is not removed effectively, it can lead to undesirable effects of higher temperature within servers and reduced life time.

Conventional cooling methods are challenged in providing sufficient cooling for today's servers and may not be sufficient to cool future servers. While liquid cooling, heat pipes, etc. have been employed to remove heat from IT equipment, there exists a need for a comprehensive solution including the infrastructure in the cabinet coupled with heat removing solution in servers.

SUMMARY

Accordingly, the present invention is directed to apparatuses, systems, and methods associated solution including the infrastructure in the cabinet coupled with heat removing solution in servers.

In one embodiment, the present invention is a thermal management system comprising: a cabinet thermal management system, the cabinet thermal management system including a cooling element; and a server thermal management system, the server thermal management system including a heat removal system and a server thermal connector, where the server thermal connector capable of being in thermal contact with the cooling element.

In another embodiment, the present invention is a thermal management system comprising: a cabinet thermal management system, the cabinet thermal management system including a cooling element and a cooling element vapor chamber; and a server thermal management system, the server thermal management system including a heat removal system and a server thermal connector, where the server thermal connector capable of being in thermal contact with the cooling element vapor chamber.

In yet another embodiment, the present invention is a thermal management system comprising: a cabinet thermal management system, the cabinet thermal management system including a cooling element, the cooling element being at least one of a cold plate, a heat pipe, and a plurality of waterlines; and a server thermal management system, the server thermal management system including a heat removal system and a server thermal connector, the server thermal management system at least partially being disposed inside an equipment chassis, where the equipment chassis includes a thermal interface window, the heat removal system includes at least one of a vapor chamber, a cold plate, and a heat sink, and being in contact with at least one heat-generating component, the server thermal connector includes a slidable thermal wedge, the slidable thermal wedge being slidable between a first and a second position, the first position preventing thermal contact between the server thermal connector and the cooling element, and the second position providing thermal contact between the server thermal connector and the cooling element through the thermal interface window.

These and other features, aspects, and advantages of the present invention will become better understood with reference to the following drawings, description, and any claims that may follow.

BRIEF DESCRIPTION OF THE DRAWINGS

FIG. 13 illustrates a front view of a server before engaging with a rack cold plate according to one embodiment of the present invention.

FIG. 14 illustrates a front view of a server while engaging with a rack cold plate according to one embodiment of the present invention.

DETAILED DESCRIPTION

Figure 1:
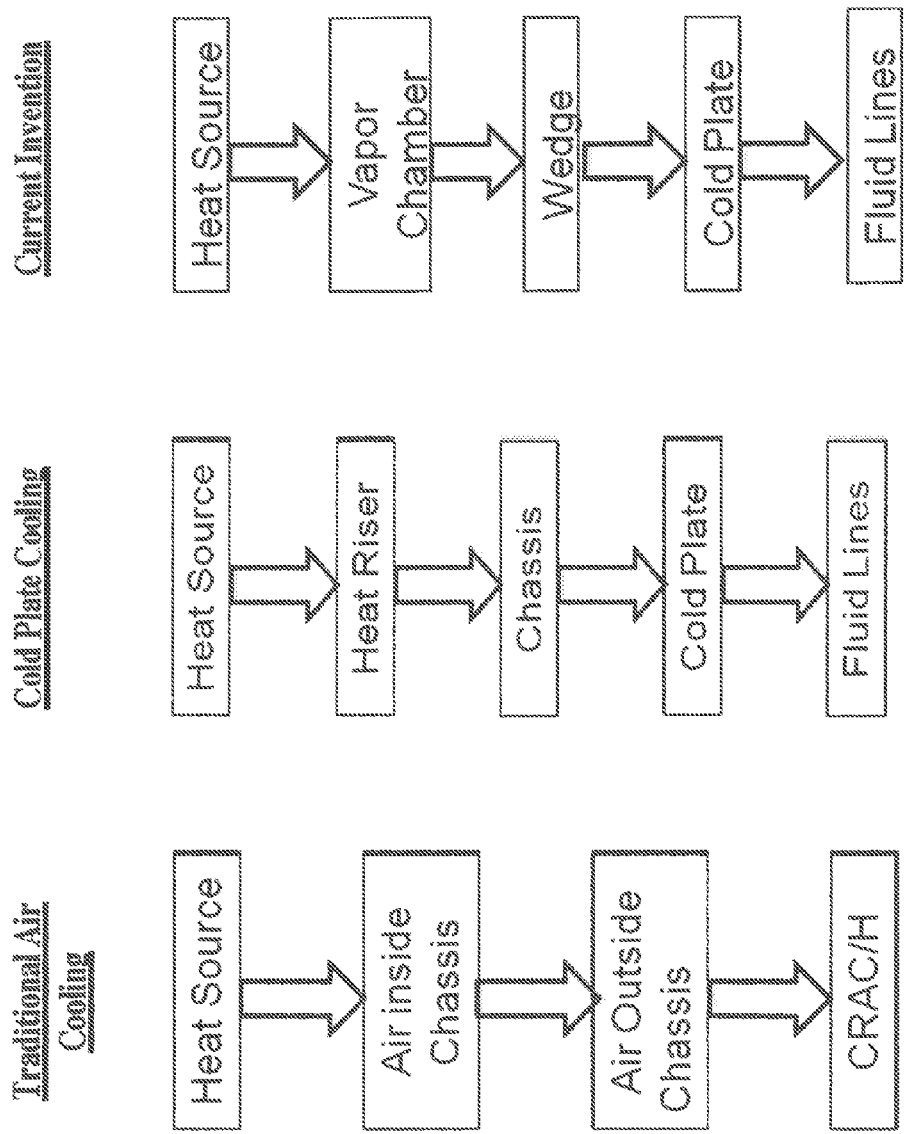
FIG. 1 illustrates a comparison of IT equipment cooling methods.

Typically, the thermal resistance between the heat source and a final heat rejection system directly determines the amount of heat dissipated during the cooling of IT equipment. In traditional air cooling, the air's high thermal resistance reduces the heat dissipation capability. In other cooling methods that incorporate cold plate technology, the thermal resistance is also considerable, due to the fact that the heat path traverses through several interface pieces including a heat riser, the chassis, and multiple cold plates. The present invention attempts to reduce the thermal resistance with the use of heat-transfer devices (e.g., vapor chambers) placed directly on the heat generating components in IT equipment and the integration of a cold plate within the cabinet. FIG. 1 generally illustrates the difference between the aforementioned cooling systems. As a result, the present invention may increase the heat dissipation capacity and reduce the power required to cool a data center.

Figure 2:
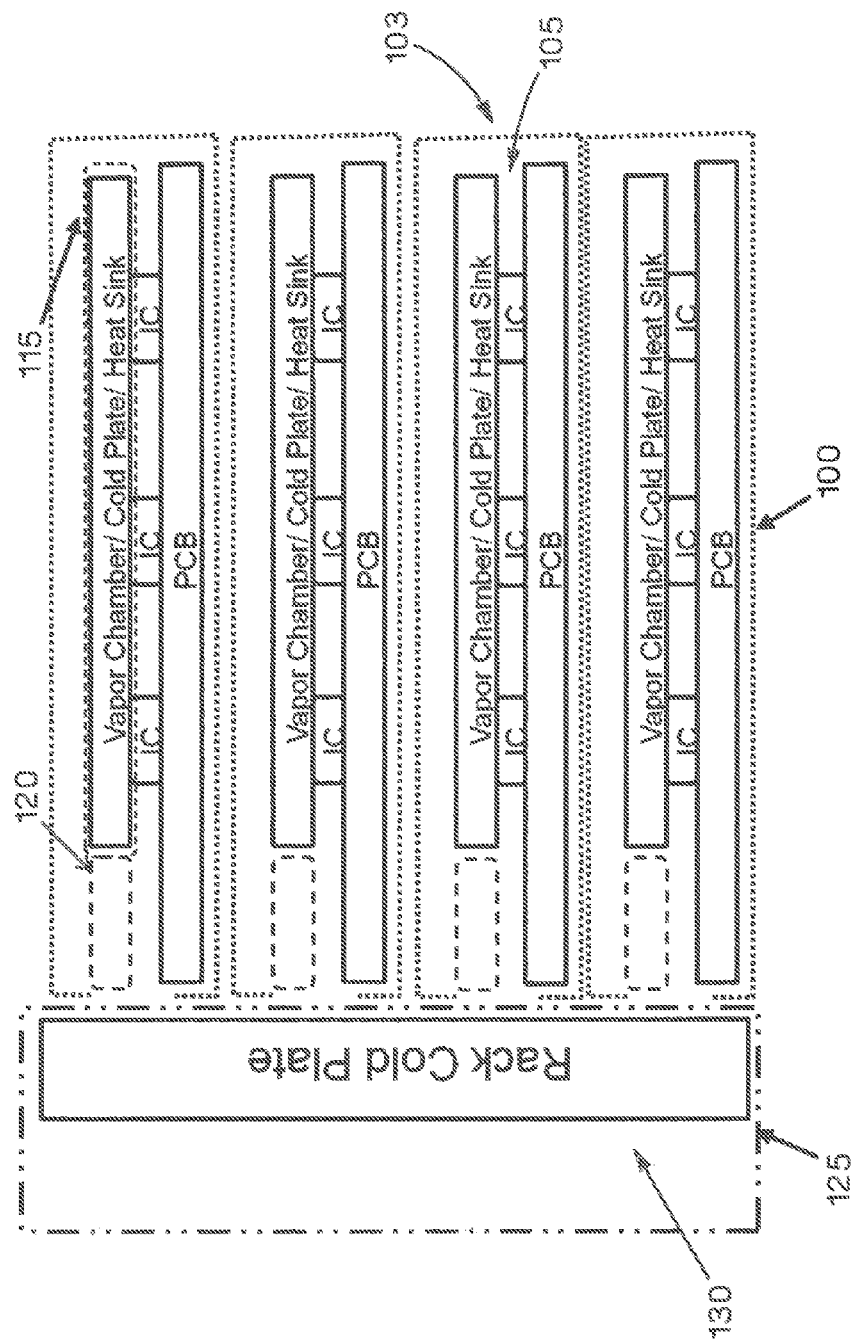
FIG. 2 illustrates a front view of a thermal management system according to an embodiment of the prevent invention.
Figure 3:
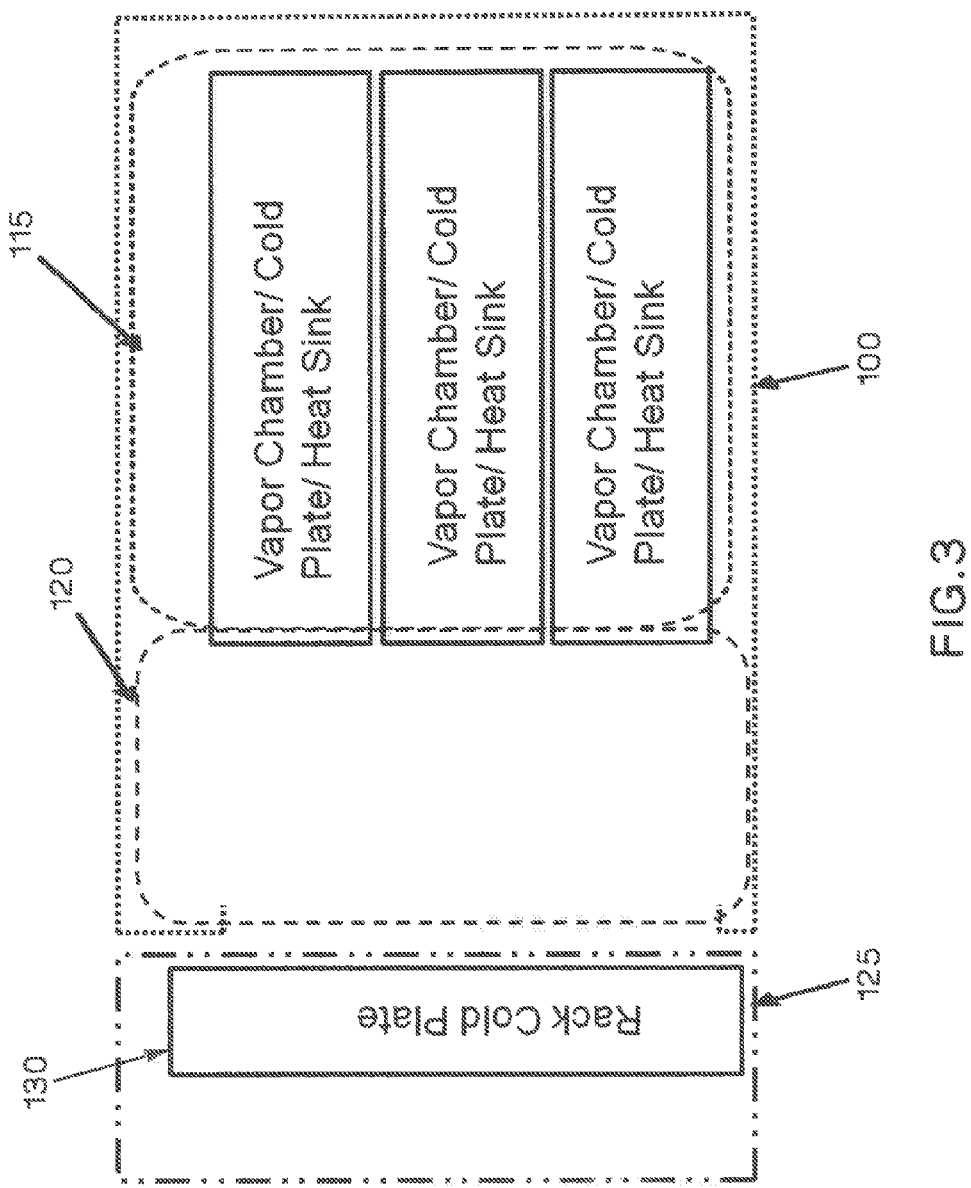
FIG. 3 illustrates a top view of a thermal management system according to an embodiment of the prevent invention.

Accordingly, in one embodiment, the present invention is a thermal management system comprising a cabinet-side thermal management system and a server-side thermal management system as shown in FIG. 1 & FIG. 2. To accommodate the server thermal management system 100, IT equipment 103 can be modified to allow heat to be extracted from the heat-generating components 105 and eventually moved out of IT equipment to the cabinet. As described and shown in the different embodiments, a server thermal management system 100 comprises a heat removal system 115, which functions to remove the heat from components mounted inside the equipment and a server thermal connector 120, which serves to provide thermal contact between the heat removal system 115 to the cabinet thermal management system 125. Depending on the embodiment, the heat removal system 115 can comprise, but is not limited to, vapor chambers (flat heat pipes)/cold plates/heat sinks with thermal interface material (TIM) to remove heat from heat-generating components and a server thermal connector 120 can comprise, but is not limited to, a vapor chamber interface, slidable thermal wedge, cabinet interface, heat pipe, heat sinks, and/or a thermal jacket.

A cabinet-side thermal management system 125 includes a cabinet with the infrastructure to accept the heat rejected from IT equipment 103. In the cabinet, a cooling element such as a cold plate 130 is provided as a part of cabinet infrastructure. The cold plate 130 runs along the entire height of rack serving as the heat sink and source for cooling. In addition to the cold plate, the cabinet thermal management system 125 can include, but is not limited to, water block/heat sink/vapor chamber to serve as interface between the cold plate 130 and the server thermal management system 100. The in-cabinet cold plate's 130 temperature is maintained above dew point in order to prevent condensation.

Referring to various embodiments shown in FIG. 4-FIG. 15, the server thermal management system 100 comprises a heat removal system (consisting of vapor chambers 135) and a server thermal connector. A window 140 is provided on the side wall of equipment's chassis 145 as a location for the transfer of heat from IT equipment to the cabinet.

Figure 4:
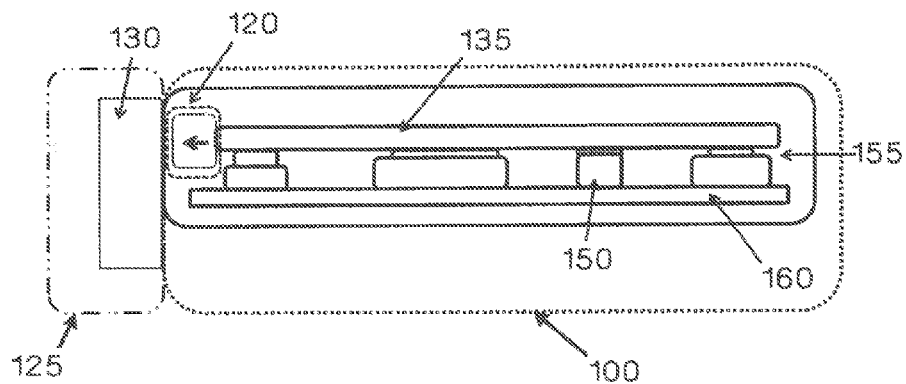
FIG. 4 illustrates a front view of a server before engaging with a rack cold plate according to one embodiment of the present invention.
Figure 5:
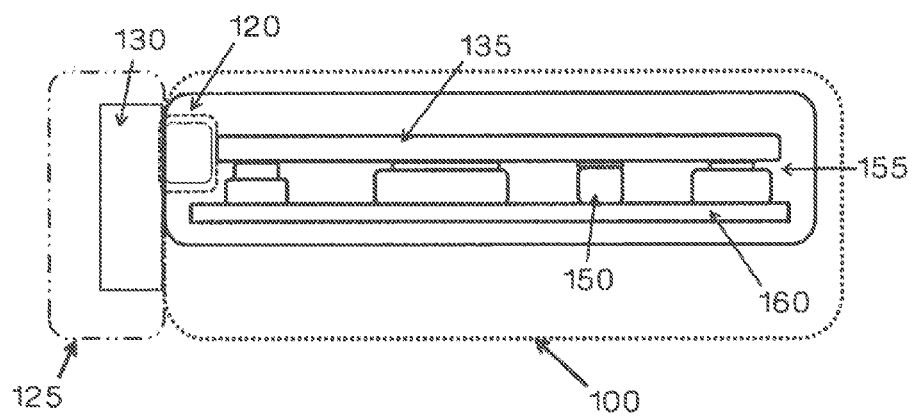
FIG. 5 illustrates a front view of a server while engaging with a rack cold plate according to one embodiment of the present invention.
Figure 6:
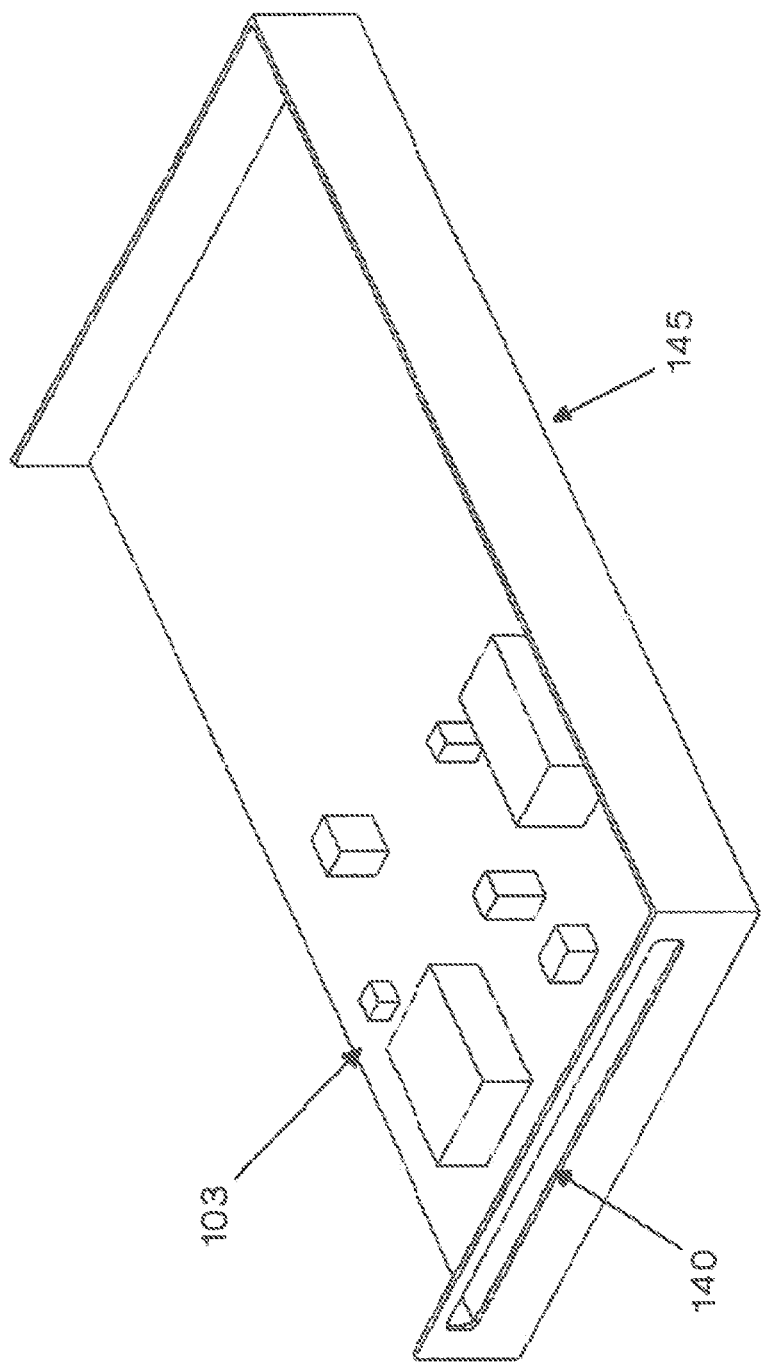
FIG. 6 illustrates an isometric view of a server chassis with a window in a sidewall for thermal contact between a server thermal management system and a cabinet thermal management system according to one embodiment of the present invention.

Inside the IT equipment, modules and components are dissipating heat. This heat can be efficiently removed and transported from the source toward the server thermal connector 120 of the IT equipment by vapor chamber(s) 135. The heat removal system can comprises either one vapor chamber encompassing all components or a system of interconnected vapor chambers placed on top of heat generating components 150 (with thermal interface material (TIM) 155) to transport the heat from the source towards the thermal interface window 140. The TIM 155 functions as a malleable heat spreading interface material between the heat source (e.g., IC components on the PCB 160 in the server) to the vapor chambers 135. Vapor chambers 135 inside the IT equipment could be planar with a TIM to accommodate for different component 150 heights or can be formed adequately to provide direct thermal contact with components 150 of varying heights. The server's thermal connector 120 has a sliding mechanism which enables it to retract inside of the server such that there will be no thermal contact when the equipment is not in its final position (FIG. 7) and slide out of the server through the thermal interface window 140 to make thermal contact with the cabinet thermal management system 125 when the IT equipment is in its final position inside the cabinet (FIG. 4 & FIG. 5).

Figure 7:
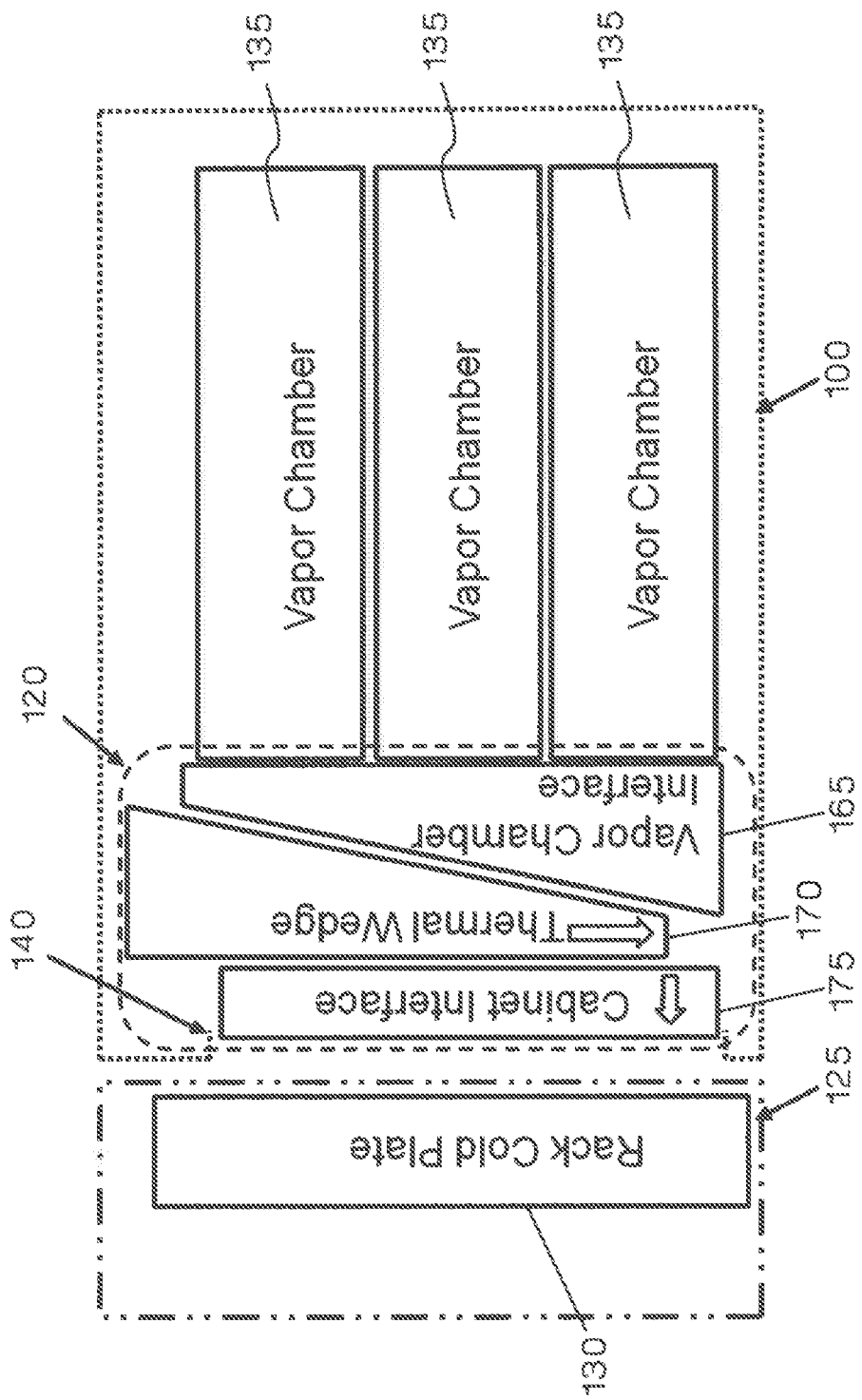
FIG. 7 illustrates a top view of a thermal management system showing a thermal interface between IT equipment and a cabinet according to one embodiment of the present invention.

The server thermal connector 120 comprises a vapor chamber interface 165, a sliceable thermal wedge 170, and a cabinet interface 175, as shown in FIG. 7. The thermal wedge 170 is capable of sliding parallel (but in the opposite direction) to the sliding direction of the IT equipment. The mechanism to activate the sliding of the thermal wedge 170 can include at least one of manual control, automated via a system within the cabinet thermal management system 125, and integrated into the sliding rails (that slides the thermal wedge based on the location of IT equipment).

The thermal wedge 170 provides a thermal connection between the vapor chamber interface 165 and the cabinet interface 175. The vapor chamber interface 165 is in thermal contact with vapor chamber(s) 135 and should be robust enough to withstand the sliding action of thermal wedge 170. The cabinet interface 175 is also in thermal contact with thermal wedge 170 and is completely inside the equipment chassis 145 when retracted.

Figure 10:
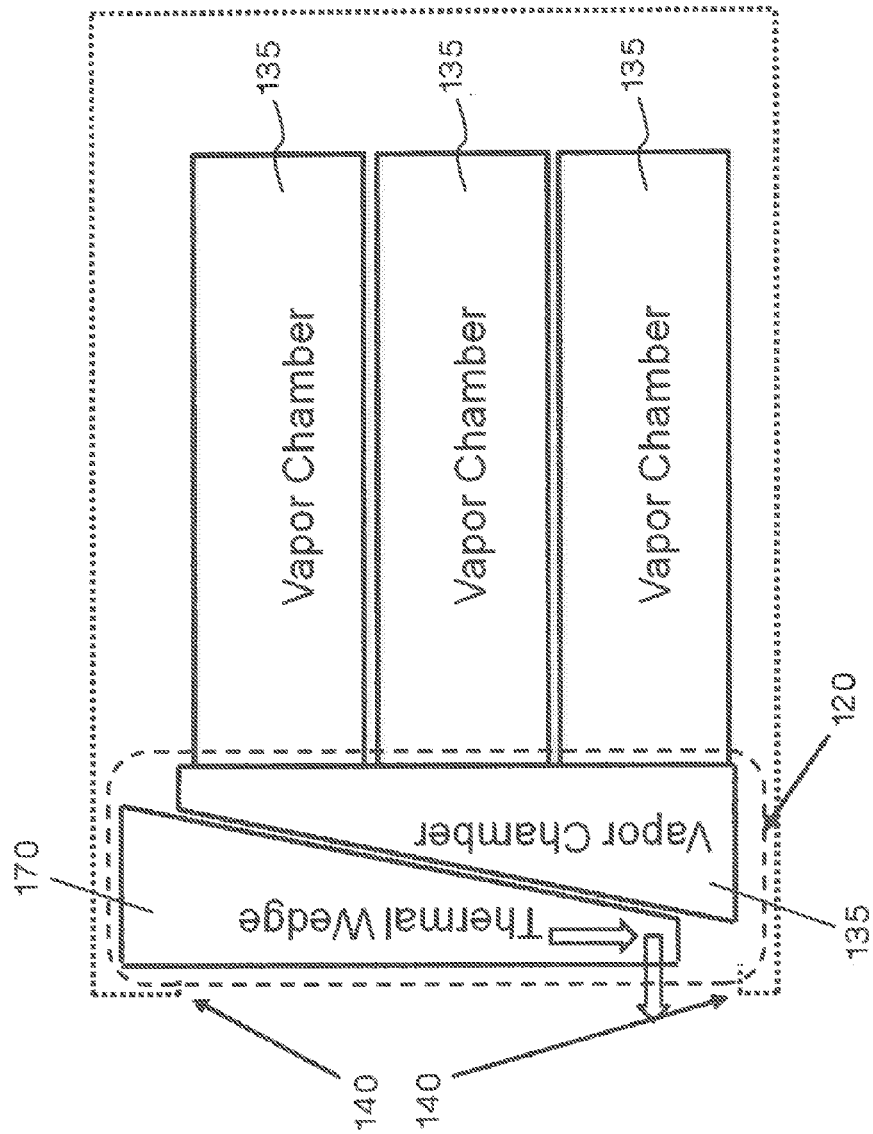
FIG. 10 illustrates an alternate embodiment of a server thermal connector.
Figure 11:
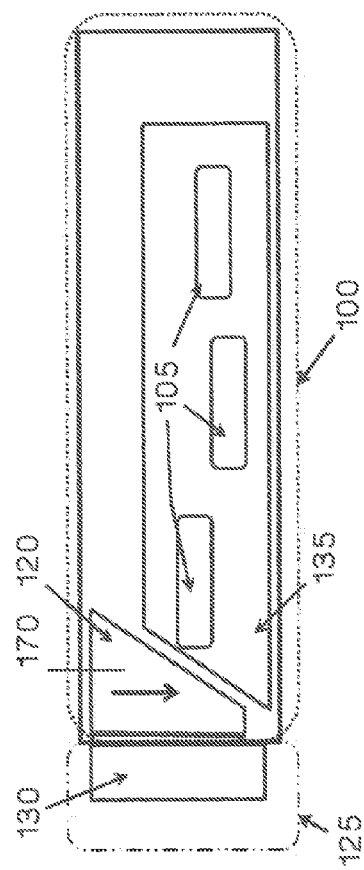
FIG. 11 illustrates a top view of a server before engaging with a rack cold plate according to one embodiment of the present invention.
Figure 12:
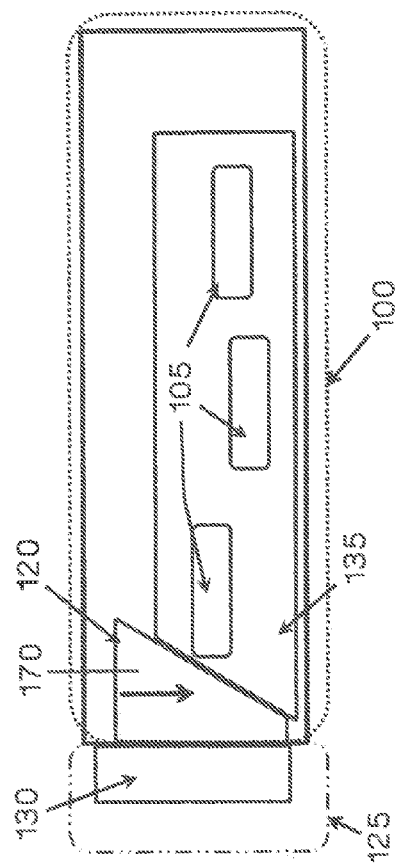
FIG. 12 illustrates a top view of a server while engaging with a rack cold plate according to one embodiment of the present invention.

In alternate embodiments, as shown in FIG. 10, the server thermal connector 120 can be consolidated in such a way that a cabinet interface feature could be integrated to thermal wedge 170 such that the thermal wedge 170 slides forward and out of the thermal interface window 140 to make contact with the cabinet's cold plate (not shown). The vapor chamber or system of vapor chambers 135 could be stiffened up such that the thermal wedge will slide on them resulting in the wedge 170 moving forward and directly contacting the cabinet's thermal system, eliminating the need for a vapor chamber interface.

Figure 8:
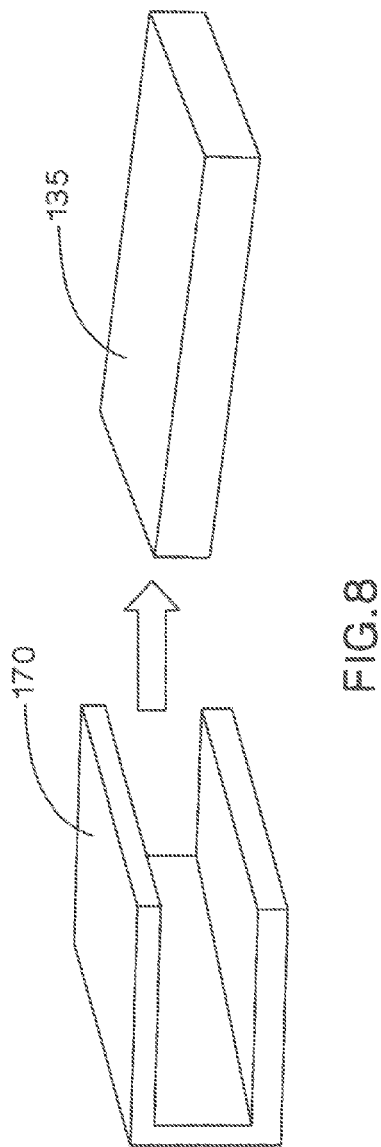
FIG. 8 & FIG. 9 illustrate various embodiment of a slidable thermal wedge.
Figure 9:
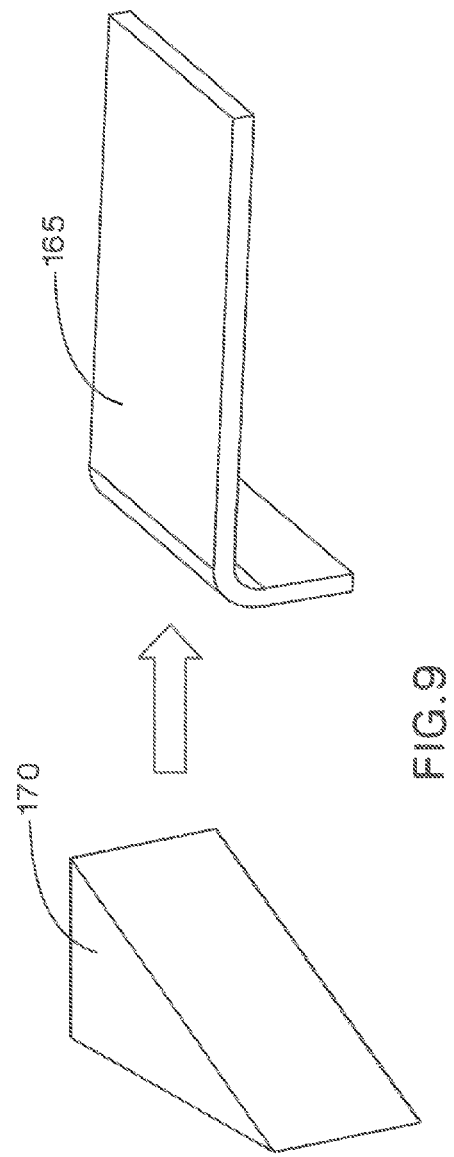

When the IT equipment is not fully inserted into the cabinet (FIG. 11), the thermal wedge 170 is in a "back" position inside the equipment chassis. Once the IT equipment is slid into the cabinet to its final position (FIG. 12), a switch mechanism is activated which slides the thermal wedge 170 towards the front panel of the IT equipment. As the thermal wedge 170 slides forward, it makes thermal contact with the vapor chamber 135 interface and cabinet interface (shown as being integrated into the wedge 170). Due to the sloped nature of thermal wedge 170 and cabinet interface, the cabinet interface will slide out of the thermal interface window making thermal contact with the cold plate 130 in the cabinet. The cabinet cold plate 130 could be connected to a chiller or to an outside environment economizer. The wedge 170 can be designed in different forms in order to optimize the thermal contact between the vapor chamber(s) 135 in the IT equipment, the cabinet's cold plate 130, and the wedge 170 itself. Examples of different embodiments of the wedge 170 are shown in FIG. 8 & FIG. 9. The wedge 170 and cabinet cold plate 130 can be spring loaded in order to provide a dynamic force for a better thermal contact.

An alternate embodiment of a server thermal connector 120 is shown in FIG. 13 & FIG. 14. The server thermal connector 120 consists of a slidable thermal wedge 170 and vapor chamber interface 165. The thermal wedge 170 is slidable in a vertical direction to initiate thermal contact between the server thermal interface (shown as being integrated into the wedge 170) and the cabinet thermal management 125 through a thermal interface window. If vapor chambers 135 contacting the heat generating components 105 are sufficiently stiffened, the vapor chamber interface 165 can be eliminated from the design and the thermal wedge 170 can directly interface with vapor chambers 135.

Figure 15:
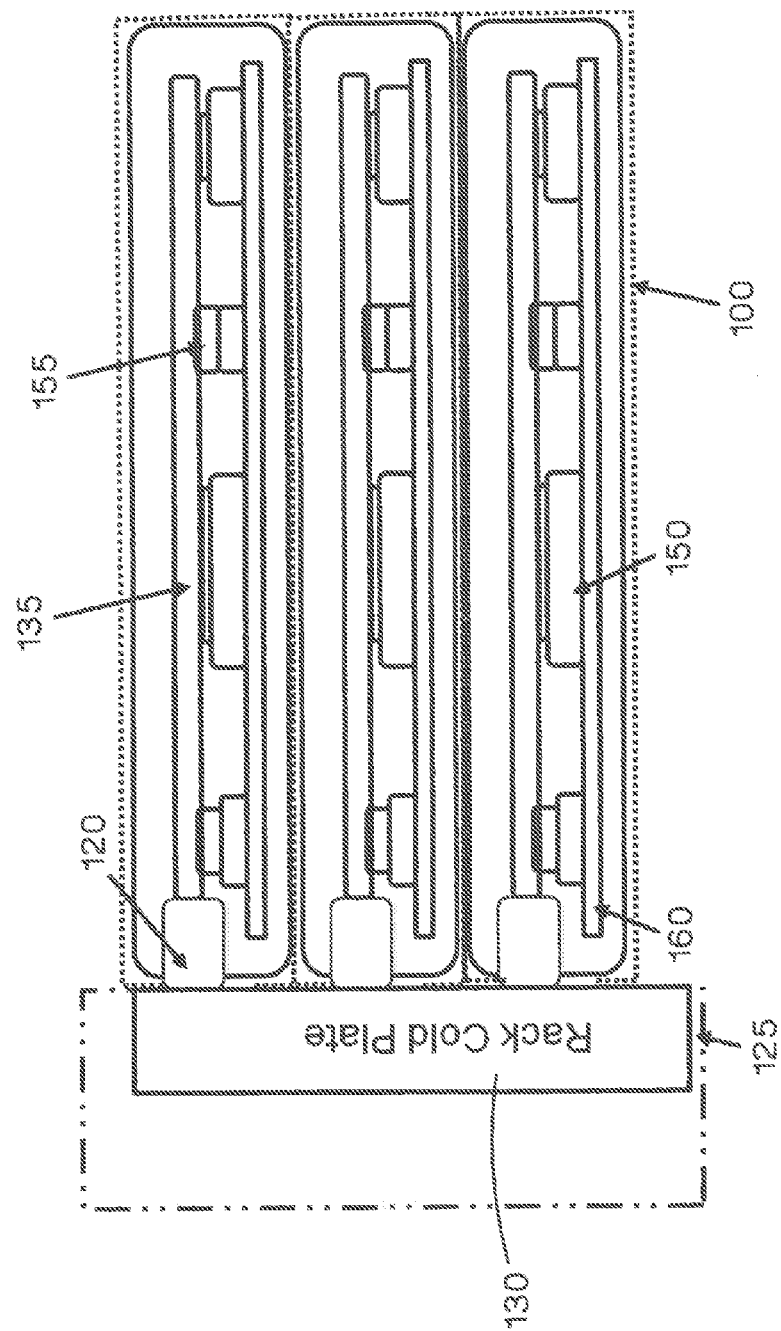
FIG. 15 illustrates a front view of a rack showing servers in thermal contact with a rack cold plate according to one embodiment of the present invention.

FIG. 15 shows the front view of plurality of IT equipment mounted inside a cabinet. All of the pieces of IT equipment shown are in thermal contact with the cold plate mounted within the cabinet.

Figure 16:
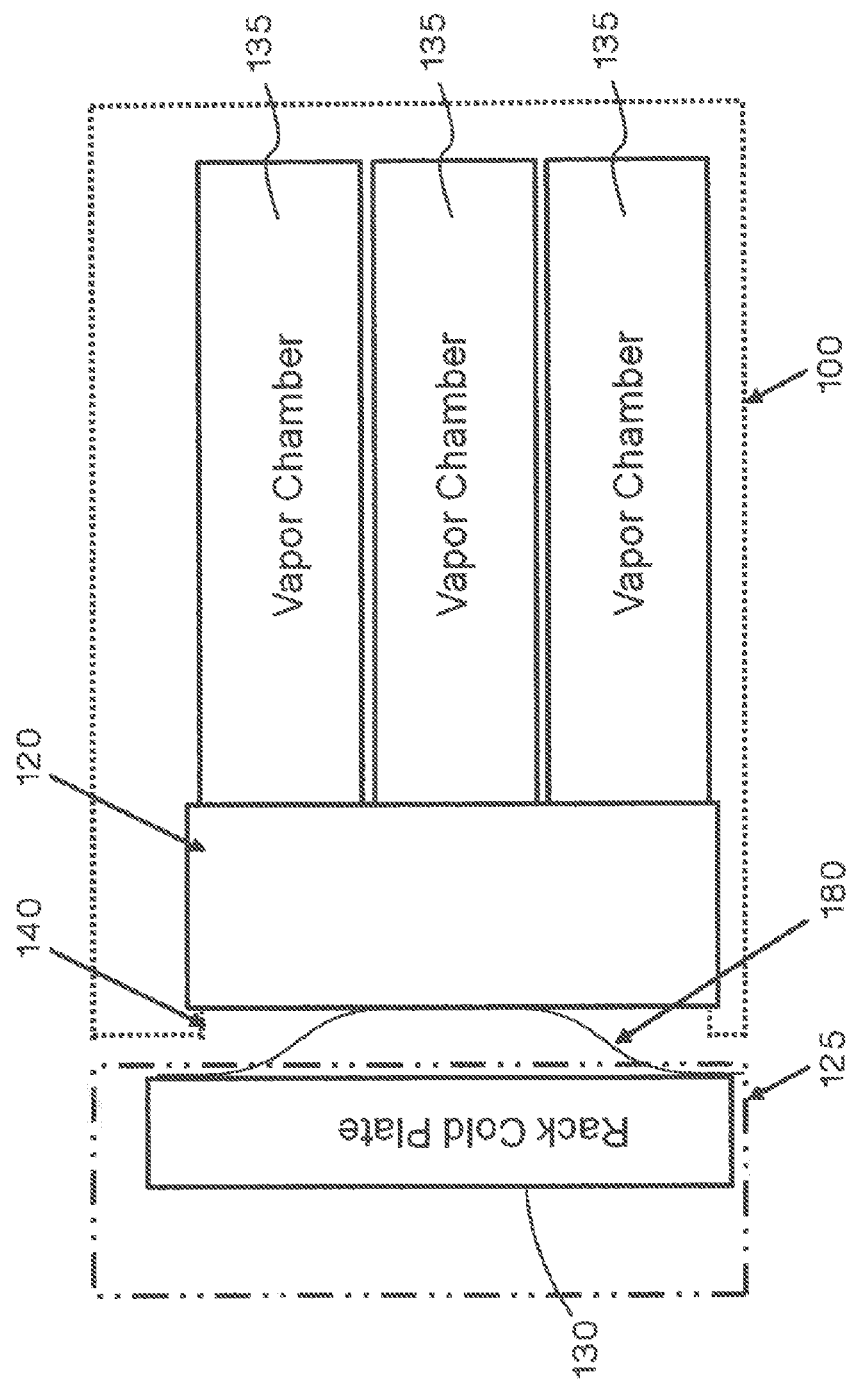
FIG. 16 illustrates a top view of a server engaging with a rack cold plate according to one embodiment of the present invention.
Figure 17:
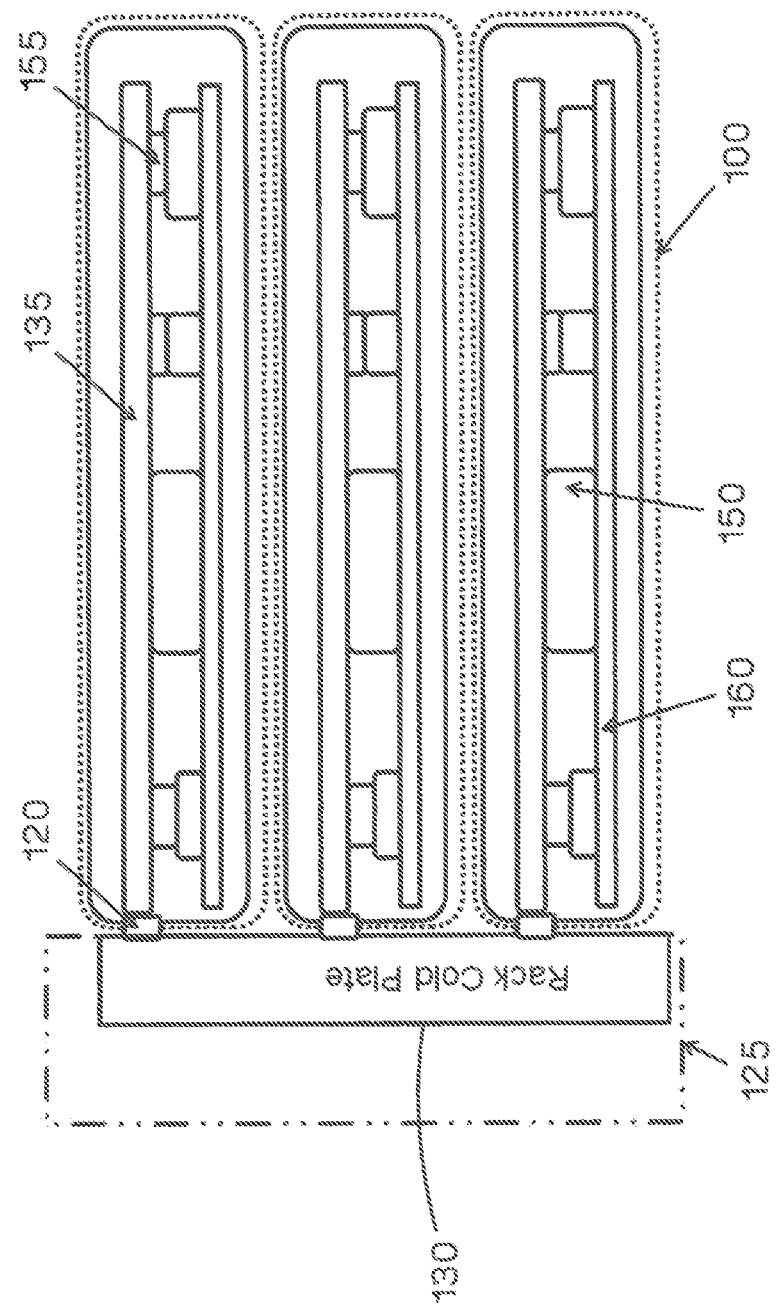
FIG. 17 illustrates a front view of a rack with servers in thermal contact with a rack cold plate through rack vapor chambers according to one embodiment of the present invention.

Other embodiments of the present invention are shown in FIG. 16 & FIG. 17, and comprise vapor chambers 135 to remove the heat from heat-generating components. The server's thermal connector 120 can comprises a vapor chamber interface, a wedge, and a cabinet interface, or the connector 120 can consolidate any combination of a vapor chamber interface, a wedge, and a cabinet interface. The cabinet thermal management system 125 comprises a cold plate 130 that runs vertically throughout the cabinet. In the currently described embodiment, the cold plate 130 includes its own set of vapor chambers 180 mounted at appropriate locations in order to make optimum thermal contact with the server thermal connectors 120 through a thermal window interface 140. Vapor chambers 180 installed on the rack's cold plate could be flexible to provide more latitude during the engagement of the server thermal connector 120 and the cabinet thermal management system 125. When IT equipment is inserted into the cabinet, the rack's vapor chamber (s) 180 slides into the thermal interface window 140 and make thermal contact with the server thermal connector 120. The heat generated from the components 150 in IT equipment is transported through the equipment vapor chamber(s) 135 and is moved towards the thermal interface window 140 through the server thermal connector 120. The heat is then eventually rejected to the rack's cold plate 130 via a rack vapor chamber 180. Heat from the rack cold plate 130 will then be rejected to a chiller, outside via an environmental economizer, or by other commonly available means.

Figure 18:
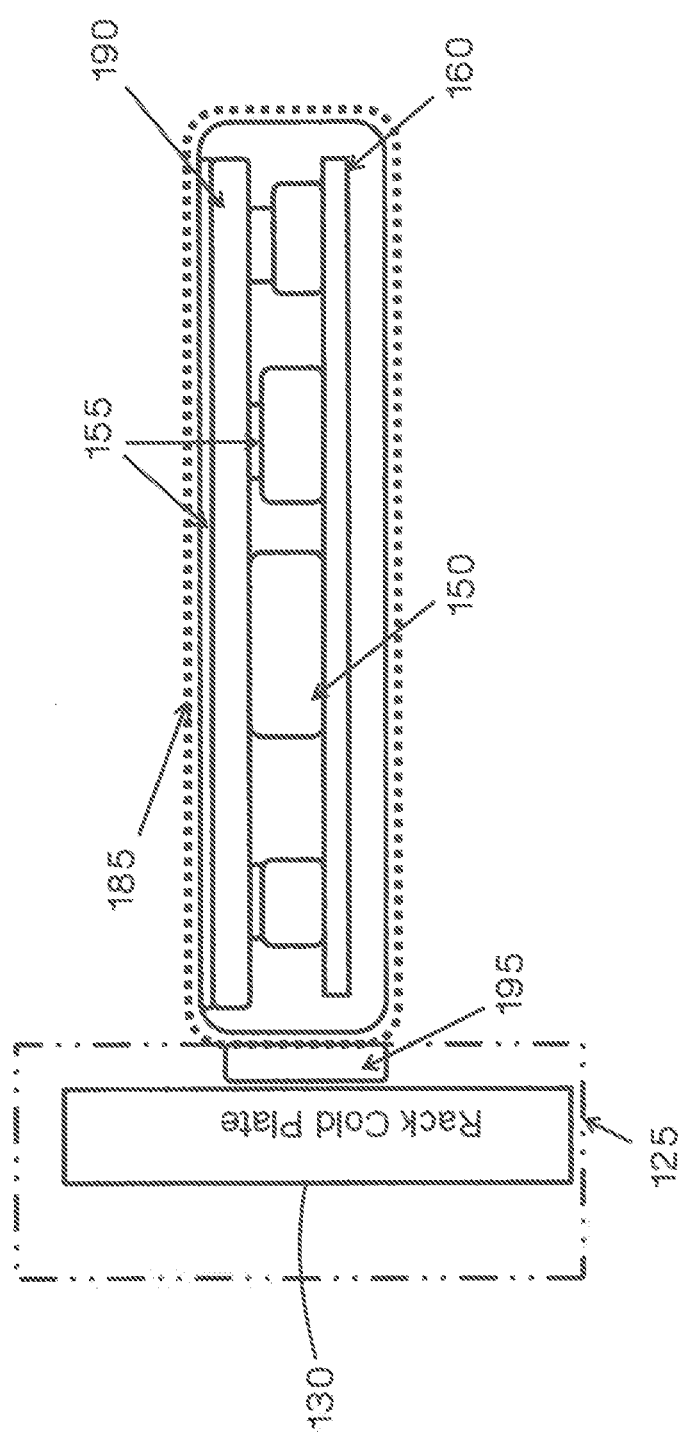
FIG. 18 illustrates a front view of a server with a thermal conducting cover in contact with a cabinet according to one embodiment of the present invention.

In another embodiment of the present invention, shown in FIG. 18, a thermal jacket 185 is a part of the server thermal management system. The thermal jacket 185 is be made of a highly thermally conductive material that forms a cover on top of the IT-equipment's chassis. In alternate embodiment, the thermal jacket can instead/also cover the front and back face of the equipment's chassis. The thermal jacket 185 functions as a heat sink (or spreader) for the heat generated by the IT equipment. The heat removal system inside the IT equipment also includes a heat sink/vapor chamber 190. The heat sink/vapor chamber 190 is placed directly on top of the components through a TIM and is used to extract the heat therefrom. The heat is then transferred to the chassis and spread to the thermal jacket 185.

In the cabinet thermal management system 125, as shown in FIG. 18, the rack's cold plate 130 interfaces with the thermal jacket 185 to remove the heat. As an alternative, the cabinet's heat sinks or water blocks 195 can be added to the cabinet thermal management system that interface between the rack's cold plate 130 and the thermal jacket 185 to provide a more-customized cooling solution. As an additional option, two rack cold plates, one on either side of the mounted IT equipment can be provisioned for enhanced heat transfer from the thermal jacket.

Figure 19:
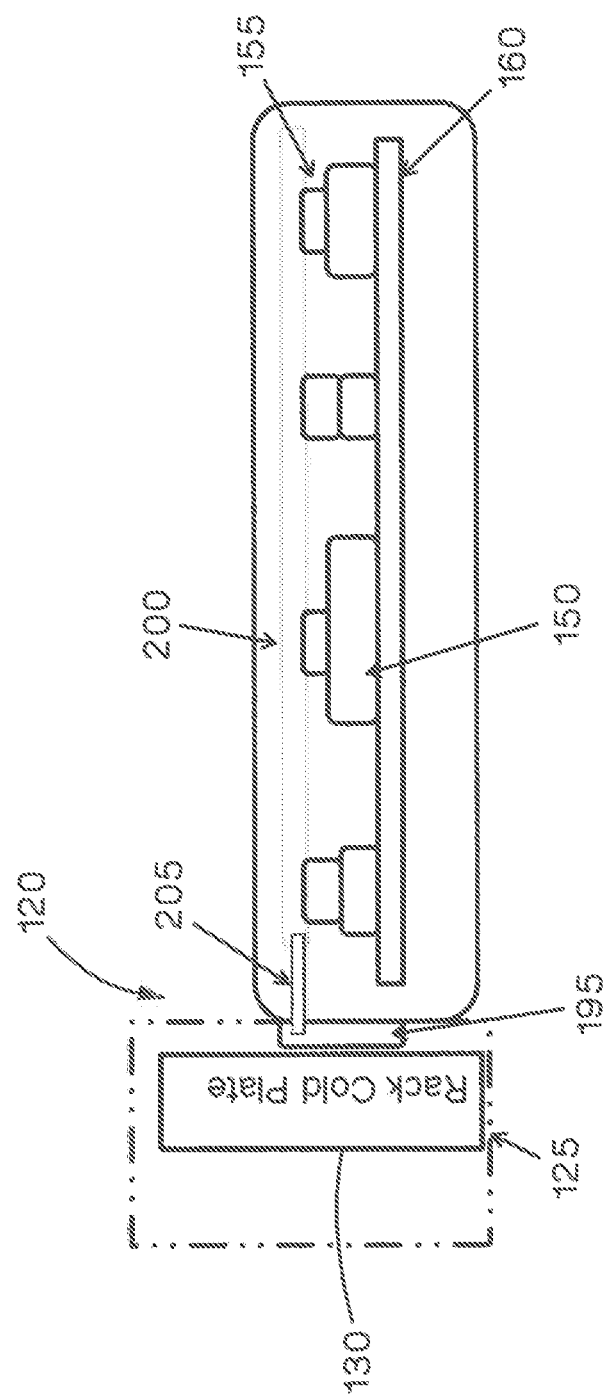
FIG. 19 illustrates a front view of a server cooled by a cold plate and a heat pipe according to one embodiment of the present invention.

In another embodiment of the present invention, shown in FIG. 19, a cold plate 200 is mounted inside the IT equipment. A single cold plate or a system of cold plates 200 is placed on top of heat-generating components 150 utilizing thermal interface material 155. As a result, the heat is transferred away from the components 150. To prevent any water/liquid connections inside the IT equipment, the server thermal connector 120 includes a system of slidable vapor chambers (e.g., heat pipes 205) that are used to move the heat from the cold plate 200 through the thermal interface window. A slidable wedge as explained in prior embodiments is used to provide thermal contact between the system of heat pipes 205, the equipment cold plate 200, and the rack's cold plate 130.

Figure 20:
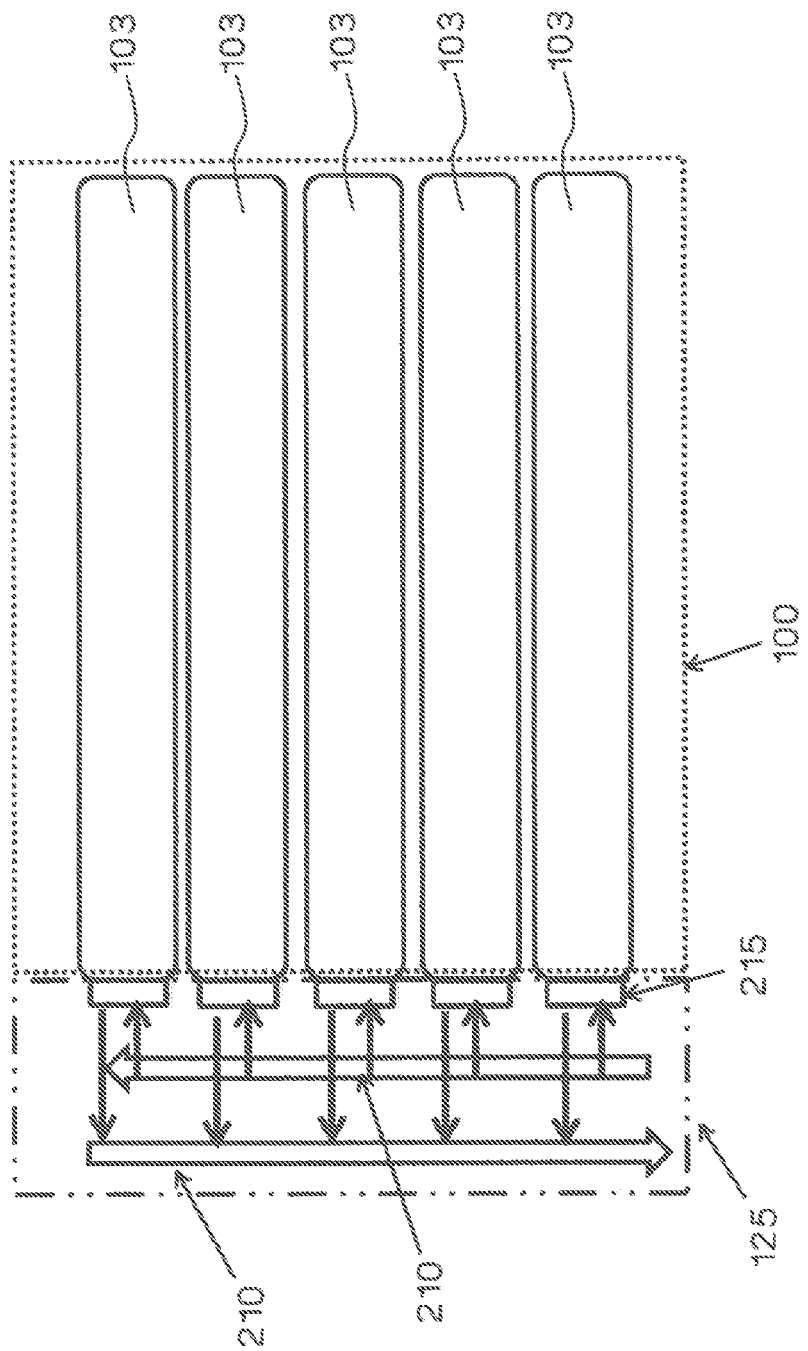
FIG. 20 illustrates a front view of servers with a water block option with inlet and outlet fluid lines as part of the cabinet infrastructure according to one embodiment of the present invention.
Figure 21:
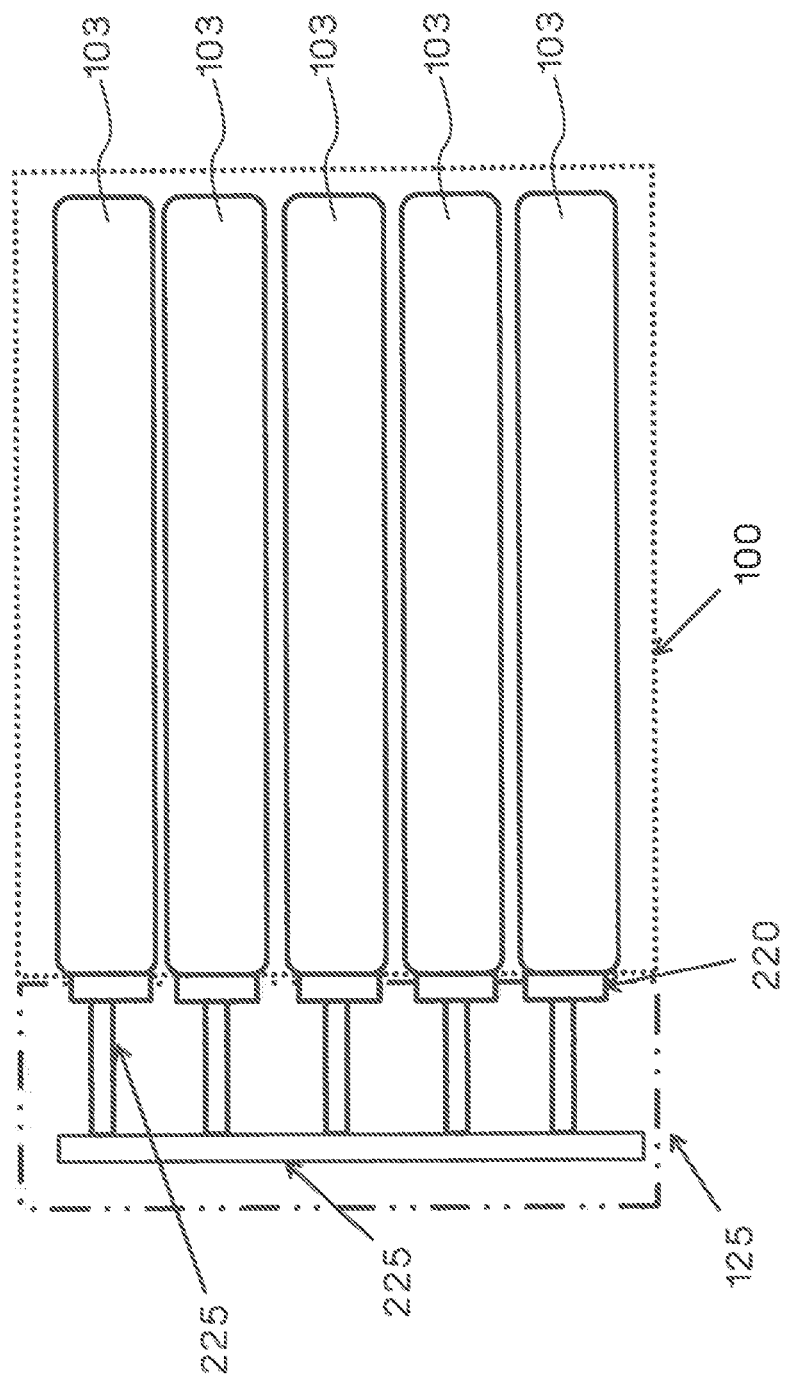
FIG. 21 illustrates a front view of servers with a heat sink option with a system of heat pipes as part of the cabinet infrastructure according to one embodiment of the present invention.

In another embodiment, the rack's cold plate 130 directly contacts the rack's heat pipe 205 to extract the heat generated. As an additional option, a heat sink or water block 195 can be a part of the cabinet infrastructure. As shown in FIG. 20, the cabinet's thermal infrastructure includes hot and cold fluid lines 210, if water blocks 215 are used to interface with the heat pipes 205. If heat sinks 220 are used as an interface, as shown in FIG. 21, a system of heat pipes 225 is used in the cabinet's thermal infrastructure to interface with the rack heat sinks 220.

Figure 22:
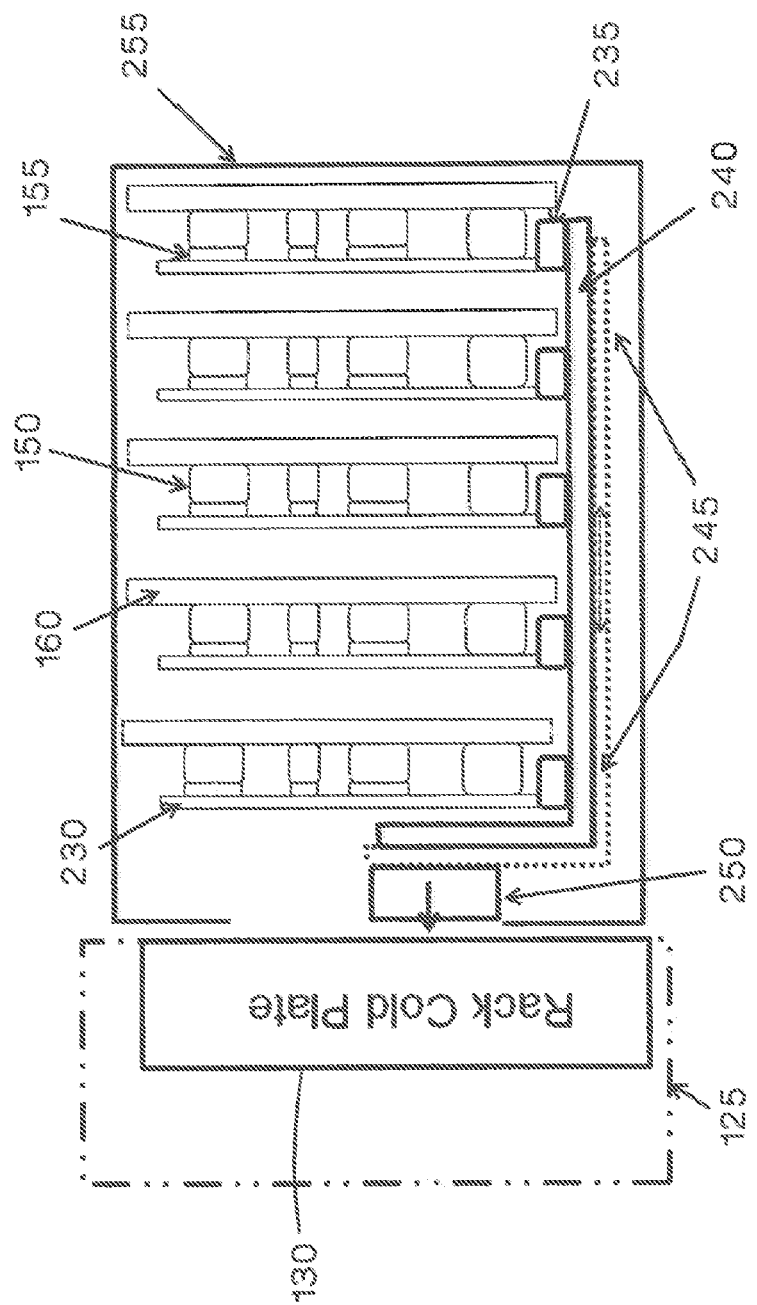
FIG. 22 illustrates a front view of a chassis in thermal contact with a cabinet thermal management system according to one embodiment of the present invention.

The above described embodiments can be adapted to cool blade server chassis mounted within a cabinet. One example of this is shown in FIG. 22. On the server thermal management side, one blade vapor chamber 230 is installed per line card as the heat removal system to remove the heat dissipated by the components 150 mounted on the PCB 160. A thermal connector in this embodiment can include blade interfaces 235 (which can be one per line or card or a common interface for all blades), one common vapor chamber 240 (chassis vapor chamber), a vapor chamber interface 245, and a slidable thermal wedge 250. Similar to the previously described embodiment shown in FIG. 6, at least one window is provided on the side wall of chassis 255 to serve as a thermal interface window. The cabinet thermal management system includes a cold plate mounted on the side of all of the IT equipment running along the cabinet.

Heat from components on the PCBs 160 is removed from a blade vapor chamber 230 and is transported to a thermal connector 120. The blade interface 235 is in thermal contact between the blade vapor chambers 230 and the chassis vapor chamber 240. This allows heat to be transported efficiently to the chassis vapor chamber 240. When the blade chassis 255 is in its initial position, the thermal wedge 250 is completely inside the chassis, and when the chassis is mounted inside the cabinet, the thermal wedge 250 slides out through the thermal interface window to make thermal contact with the rack's thermal system. As a result, the heat produced by the components in the blade is removed by blade vapor chambers 230 and moved through the thermal interface window via the thermal connectors and is rejected to the rack's cold plate 130. The sliding of the thermal wedge 250 can be activated by any method described in the previous embodiments or by any other typical mechanism.

The thermal connector can also function without a chassis vapor chamber whereby the heat is directly transferred from components to a blade vapor chamber to a vapor chamber interface and finally to the thermal wedge. Likewise, if a chassis vapor chamber is sufficiently stiffened, the vapor chamber interface can be eliminated. In this embodiment, the addition of a chassis vapor chamber interfacing between blade vapor chambers and thermal wedge can efficiently reduce the overall systems thermal resistance.

Figure 23:
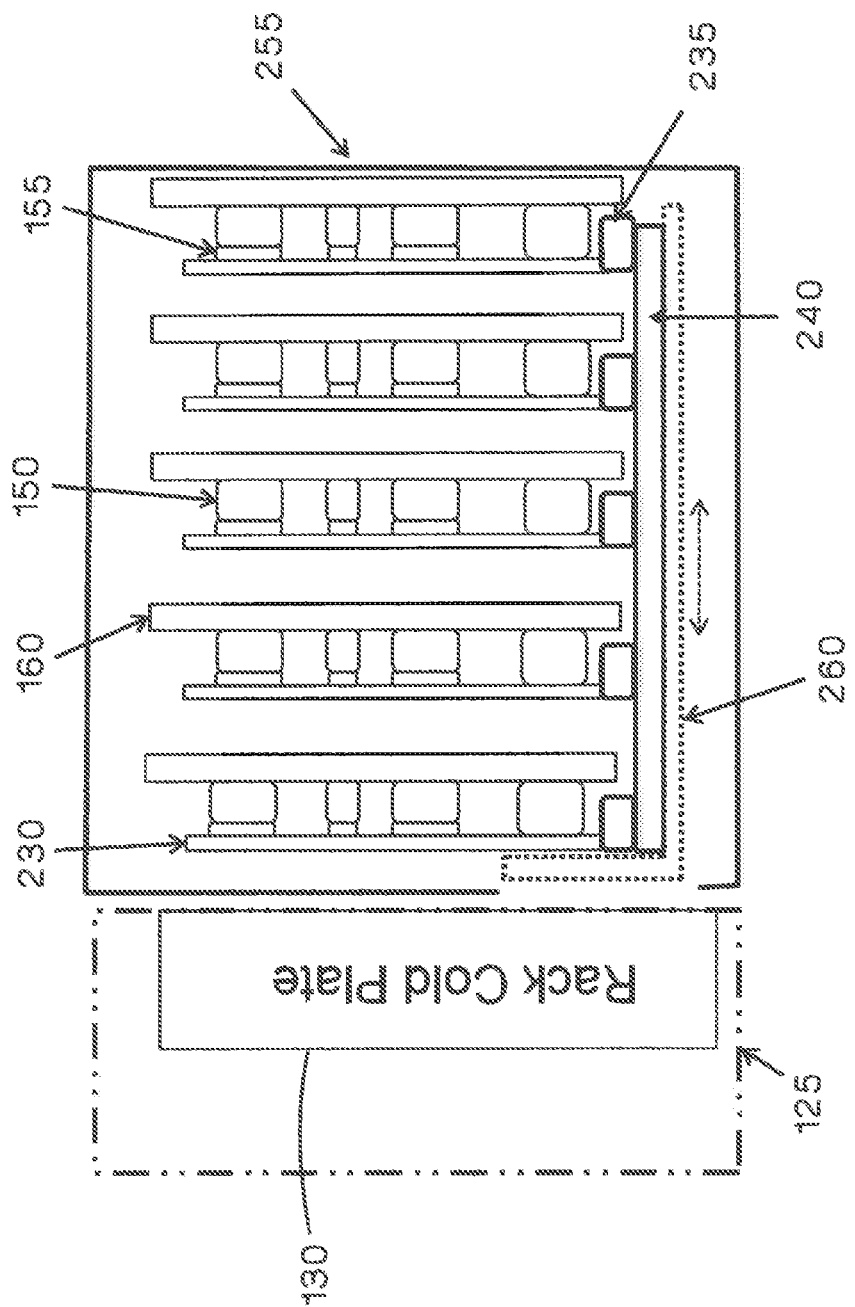
FIG. 23 illustrates a front view of a chassis in thermal contact with a cabinet thermal management system according to one embodiment of the present invention.

In an alternative embodiment, shown in FIG. 23, the thermal connector can comprise a blade interface 235, a chassis vapor chamber 240, and a cabinet interface 260, which is slidable and appropriately provided at either the top or bottom within the blade chassis 255. The blade interface 235 has a thermal contact between a blade vapor chamber 230 and a chassis vapor chamber 240. The cabinet interface 260 in turn is thermally connected to the chassis vapor chamber 240. When the chassis is not in its final position inside the cabinet, the cabinet interface will be completely inside the chassis. Once the chassis is mounted and in its final position within the cabinet, the cabinet interface 260 slides out of the thermal interface window and makes thermal contact between the chassis vapor chamber 240 and the rack cold plate 130. Similar to a previously described embodiment, the thermal connector functions if the chassis vapor chamber 240 is eliminated where the cabinet interface 260 has thermal contact between the rack cold plate 130 and a blade vapor chamber 230. Likewise, if the chassis vapor chamber 240 is sufficiently stiffened, the thermal connector can function if the chassis vapor chamber 240 is added without a cabinet interface 260. In such a case, the chassis vapor chamber 240 will make thermal contact between the blade vapor chambers 230 and the rack cold plate 130, thereby reducing the thermal resistance.

Figure 24:
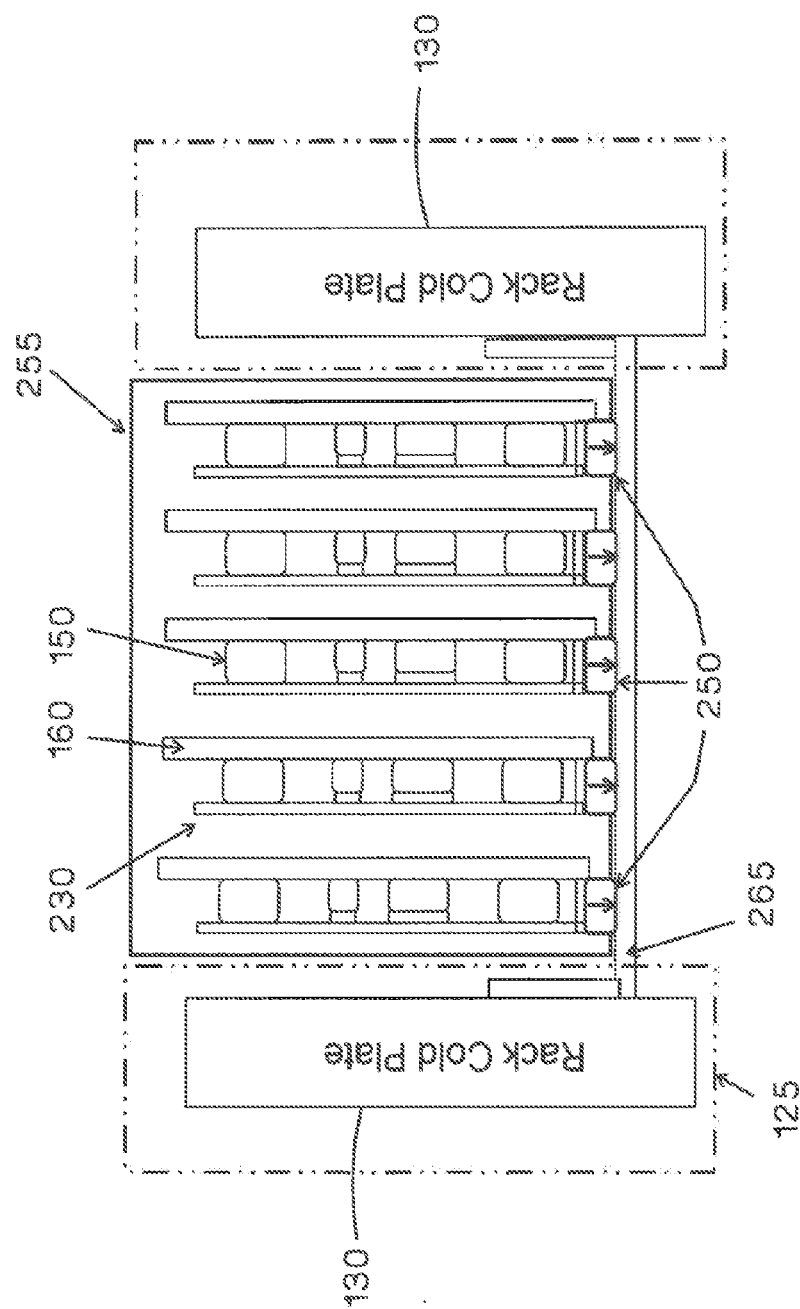
FIG. 24 illustrates a front view of a chassis in thermal contact with a cabinet thermal management system according to one embodiment of the present invention.

FIG. 24 shows a yet another embodiment. In this embodiment, a rack vapor chamber 265 is installed as part of the cabinet thermal management system 125 in the front mounting post in a partial RU (rack unit) space, allowing the rack vapor chamber 265 to be in thermal contact with the rack cold plate(s) 130. In an alternate embodiment, each rack vapor chamber 265 can be positioned so that each rack vapor chamber 265 effectively remove heat from one blade chassis 255 above and one blade chassis below the rack's position. The blade vapor chamber 230 is mounted on top of the heat-generating components 150 on its PCB 160 and is within the chassis 255. The thermal connector is in thermal contact with the blade vapor chambers 230 and can make thermal contact with the rack vapor chambers 265 via a slidable wedge 250. When the IT equipment is slid back and installed in its final position, the wedge 250 slides and makes contact with both blade vapor chambers 230 within the IT equipment and the rack vapor chamber 265. The heat is then transferred from the rack vapor chambers 230 to the rack cold plate(s) 130 and finally to a chiller or an outside environmental economizer.

As a result of direct heat transfer, the thermal management system of the present invention may help reduce the thermal resistance between the heat source and the final heat rejection system. This may enable a higher operating temperature for the final heat exchanger which could be a chiller or an outside environmental economizer, resulting in reduced energy usage and higher thermal efficiency.

In some embodiments, the cooling solution of the present invention minimizes the impact on current apparatus standards and can be utilized with the commonly accepted dimensions of rack units.

In other embodiments, using vapor chambers and/or heat pipes as opposed to cold plates may reduce the risk of leakage of fluids inside the server.

In still other embodiments, by using vapor chambers and/or heat pipes and limiting the supply/return lines to a single cold plate per rack, failures due to fluid lines and connections may be reduced.

In still other embodiment, the amount of fluid flow and pumping power can be reduced since one cold plate per rack is used as opposed to one cold plate per piece of IT equipment.

Note that while this invention has been described in terms of one or more embodiment(s), these embodiment(s) are non-limiting, and there are alterations, permutations, and equivalents, which fall within the scope of this invention. It should also be noted that there are many alternative ways of implementing the methods and apparatuses of the present invention. It is therefore intended that claims that may follow be interpreted as including all such alterations, permutations, and equivalents as fall within the true spirit and scope of the present invention.

We claim:

1. A thermal management system comprising:
   a cabinet including a cabinet thermal management system, said cabinet thermal management system including a cooling element; and
   an equipment chassis slidable into said cabinet, said equipment chassis including a server thermal management system, said server thermal management system including a heat removal system and a server thermal connector,
   wherein said server thermal connector includes a heat removal system interface connected to said heat removal system, a cabinet interface for interfacing to said cooling element, and a slidable thermal wedge disposed between said heat removal system interface and said cabinet interface, said slidable thermal wedge being slidable between a first position relative to said equipment chassis and a second position relative to said equipment chassis, said first position preventing thermal contact between said cabinet interface and said cooling element, and said second position providing thermal contact between said cabinet interface and said cooling element.

2. The thermal management system of claim 1, wherein said heat removal system includes at least one of a vapor chamber, a cold plate, or a heat sink.

3. The thermal management system of claim 1, wherein said heat removal system is in contact with at least one heat-generating component installed in said equipment chassis.

4. The thermal management system of claim 3, wherein a thermal interface material is disposed between said heat removal system and said at least one heat-generating component.

5. The thermal management system of claim 1, wherein a movement of said slidable thermal wedge into said first position causes said cabinet interface to disengage from said cooling element, and wherein a movement of said slidable thermal wedge into said second position causes said cabinet interface to engage said cooling element.

6. The thermal management system of claim 1, wherein said equipment chassis has a thermal interface window, and
   wherein said thermal contact between said server thermal connector and said cooling element occurs through said thermal interface window.

7. The thermal management system of claim 1, wherein said cabinet interface is moveable in response to movement of said slidable thermal wedge.

8. The thermal management system of claim 1, wherein said slidable thermal wedge is activated by at least one of manual control, automated control, or mechanical actuation in response to installation of said equipment chassis.

9. The thermal management system of claim 1, where said cooling element includes at least one of a cold plate, a water block, a heat sink, or a vapor chamber.

10. The thermal management system of claim 1, wherein said server thermal management system includes a thermal jacket, said thermal jacket covering at least a portion of said equipment chassis.

11. The thermal management system of claim 10, wherein at least one of a heat sink or a water block is disposed between said cooling element and said thermal jacket.

12. The thermal management system of claim 10, wherein said cooling element includes a first cooling element and a second cooling element, said first cooling element and said second cooling element being positioned on opposite sides of said equipment chassis.

13. A thermal management system comprising:
a cabinet including a cabinet thermal management system, said cabinet thermal management system including a cooling element and a cooling element vapor chamber, said cooling element vapor chamber comprising a flexible wall; and
an equipment chassis slidable into said cabinet, said equipment chassis including a server thermal management system, said server thermal management system including a heat removal system and a server thermal connector, said equipment chassis having a thermal interface window,
wherein at least a part of said flexible wall of said cooling element vapor chamber is capable of sliding into said thermal interface window of said equipment chassis to make thermal contact with said server thermal connector.

14. The thermal management system of claim 13, wherein said heat removal system includes at least one of a heat removal system vapor chamber, a cold plate, or a heat sink.

15. The thermal management system of claim 13, wherein said server thermal connector includes a slidable thermal wedge, said slidable thermal wedge being slidable between a first position and a second position, said first position preventing thermal contact between said server thermal connector and said cooling element vapor chamber, and said second position providing thermal contact between said server thermal connector and said cooling element vapor chamber through said thermal interface window.

16. A thermal management system comprising:
a cabinet including a cabinet thermal management system, said cabinet thermal management system including a cooling element, said cooling element being at least one of a cold plate, a heat pipe, or a plurality of waterlines; and
an equipment chassis slidable into said cabinet, said equipment chassis including a server thermal management system, said server thermal management system including a heat removal system and a server thermal connector,
wherein said equipment chassis includes a thermal interface window,
wherein said heat removal system includes at least one of a vapor chamber, a cold plate, or a heat sink, said heat removal system being in contact with at least one heat-generating component installed in said equipment chassis, and
wherein said server thermal connector includes a heat removal system interface connected to said heat removal system and a slidable thermal wedge, said slidable thermal wedge being slidable against said heat removal system interface between a first position relative to said equipment chassis and a second position relative to said equipment chassis, a movement of said slidable thermal wedge into said first position retracting said server thermal connector inside of the equipment chassis and preventing thermal contact between said server thermal connector and said cooling element, and a movement of said slidable thermal wedge into said second position extending said server thermal connector out of said thermal interface window of said equipment chassis and providing thermal contact between said server thermal connector and said cooling element.

17. The thermal management system of claim 16, wherein a thermal interface material is disposed between said heat removal system and said at least one heat-generating component.

18. The thermal management system of claim 16, wherein said server thermal connector further includes a cabinet interface, said slidable thermal wedge being disposed between said heat removal system interface and said cabinet interface, said cabinet interface being moveable in response to movement of said slidable thermal wedge.

19. The thermal management system of claim 16, wherein said cooling element includes a cooling element vapor chamber, said cooling element vapor chamber comprising a flexible wall.

* * * * *